United States Patent [19]
Shiga et al.

[11] Patent Number: 5,104,849
[45] Date of Patent: Apr. 14, 1992

[54] OXIDE SUPERCONDUCTOR AND METHOD OF MANUFACTURING THE SAME

[75] Inventors: Shoji Shiga, Utsunomiya; Naoki Uno; Noritsugu Enomoto, both of Yokohama; Hiroyuki Kikuchi, Yokosuka, all of Japan

[73] Assignee: The Furukawa Electric Co., Ltd., Tokyo, Japan

[21] Appl. No.: 464,345

[22] Filed: Jan. 12, 1990

[30] Foreign Application Priority Data

Jun. 6, 1989 [JP] Japan .................................. 1-143759
Jun. 14, 1989 [JP] Japan .................................. 1-151029

[51] Int. Cl.$^5$ .............................................. B32B 9/00
[52] U.S. Cl. .................................. 505/1; 505/701; 505/702; 505/703; 505/704; 428/68; 428/76; 428/209; 428/426; 428/432; 428/457; 428/688; 428/901; 428/930
[58] Field of Search ................ 505/1, 701–704; 428/68, 76, 209, 426, 432, 457, 688, 901, 930

[56] References Cited

FOREIGN PATENT DOCUMENTS 0306287 3/1989 European Pat. Off. .
3729125 3/1989 Fed. Rep. of Germany .

OTHER PUBLICATIONS

Japanese Journal of Applied Physics, vol. 27, No. 9, 1988, pp. L1715–L1717, Tokyo, Japan; M. Okada et al., "Neutron Diffraction Study on Preferred Orientation of Ag-Sheathed Y-Ba-Cu-O Superconductor Tape with $J_c$-1000-3000A/cm$^2$".
Japanese Journal of Applied Physics, vol. 26, No. 6, Jun., 1987, pp. L1043–L1045.
Japanese Journal of Applied Physics, vol. 26, No. 7, Jul., 1987, pp. L1168–L1171.
R. Bruzzese et al., "Improved Critical Current Densities in Nb$_3$Al Based Conductors", IEEE Transactions on Magnetics, vol. Mag-23, No. 2, Mar. 1987.
W. K. McDonald et al., "Manufacture and Evaluation of Nb$_3$Sn Conductors Fabricated by the MJR Method", 1982 Applied Superconductivity Conference, Nov. 30–Dec. 3, 1982.

*Primary Examiner*—Patrick J. Ryan
*Attorney, Agent, or Firm*—Frishauf, Holtz, Goodman & Woodward

[57] ABSTRACT

An oxide superconductor having oxide superconductor layers and metal material layers, which are alternately laminated on each other by a desired number of times, and a method of manufacturing the same.

30 Claims, 5 Drawing Sheets

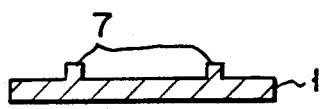
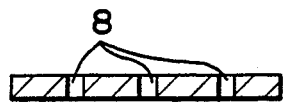
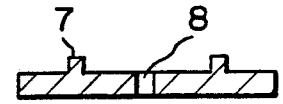
F I G. 7A  F I G. 7B  F I G. 7C
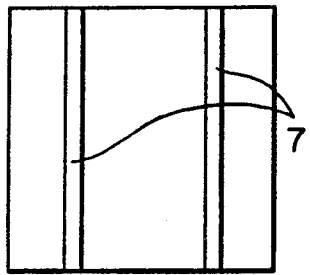
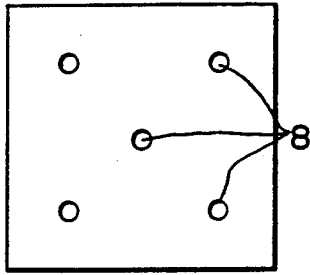
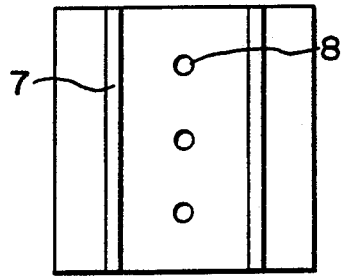
F I G. 7D  F I G. 7E  F I G. 7F
F I G. 8
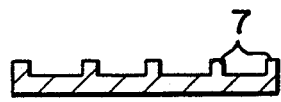
F I G. 10A
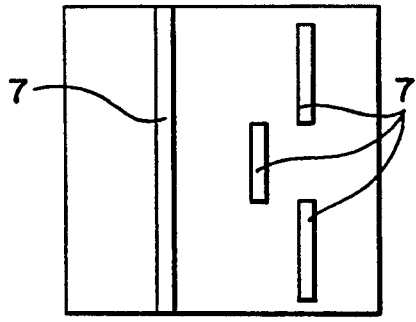
F I G. 9
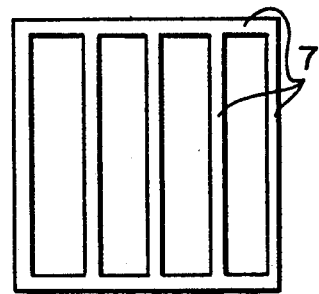
F I G. 10B

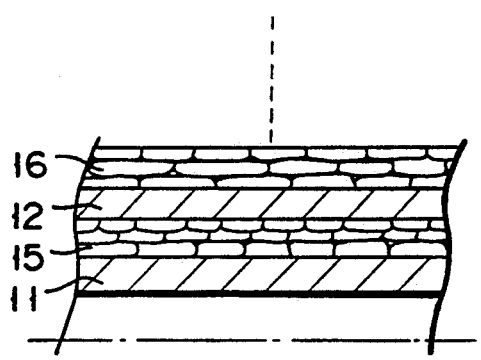
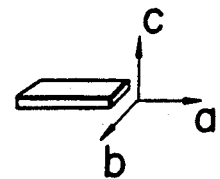
FIG. 14A    FIG. 14B
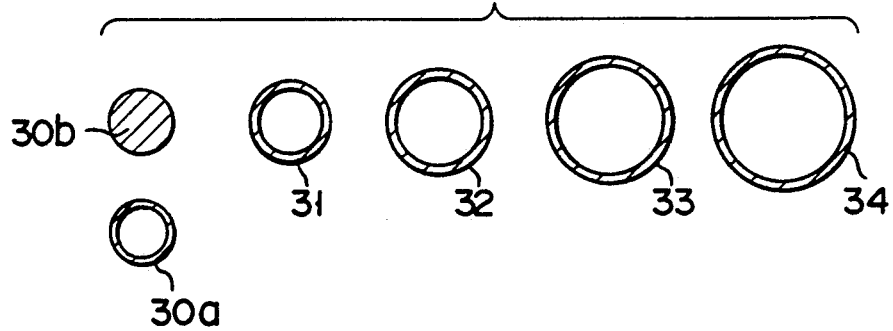
FIG. 15
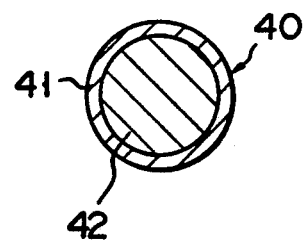
FIG. 16

OXIDE SUPERCONDUCTOR AND METHOD OF MANUFACTURING THE SAME

BACKGROUND OF THE INVENTION

1. Field of the Invention

The present invention relates to an oxide superconductor used in a transmission and distribution wire, a power cable, an equipment lead wire, a magnet wire, and a magnetic shield and a method of manufacturing the same and, more particularly, to an oxide superconductor capable of supplying a large current with zero resistance or small alternating-current loss.

2. Description of the Related Art

An intermetallic compound such as NbTi, $Nb_3Sn$, $Nb_3Al$, or $V_3Ga$ and a metal such as Nb or Pb are used as superconductive magnets, magnetic shields, coaxial cables, and cavities by utilizing an ultra low-temperature refrigerant such as liquid helium. These metallic materials, however, are limited as resources. In addition, helium is used to increase cost, which limits the range of practical applications.

To the contrary, some substances which can be rendered superconductive at low critical temperature (Tc) by inexpensive refrigerants have been found, and extensive studies on practical use of such substances in a variety of applications have been actively made.

As the high Tc materials described above, $La_{2-x}Ba_xCuO_4$ and $La_{2-x}Sr_xCuO_4$ oxide superconductors have critical temperatures of 30° to 45° K.; a Y(Dy, Er, Ho)-$Ba_2Cu_3O_{7-\delta}$ oxide superconductor has a critical temperature of up to 95° K.; Bi-Sr-Ca-Cu-O based oxide superconductors such as $Bi_2Sr_2CaCu_2O_8$ and $Bi_2Sr_2Ca_2Cu_3O_{10}$ oxide superconductors have critical temperatures of 80° to 110° K.; and Tl-Ba-Ca-Cu-0 based oxide superconductors such as $Tl_2Ba_2CaCu_2O_8$, $Tl_2Ba_2Ca_2Cu_3O_{10}$ and $TlBa_2Ca_2Cu_7O_{8.5}$ oxide superconductors have critical temperatures of 90° to 125° K. These oxide superconductors are manufactured as follows. A powder of each superconductor is kneaded with an organic binder to obtain a paste, and the paste is directly extrusion molded or screen-printed. Alternatively, the powder of each superconductor is filled in an Ag pipe or the like, and the pipe is elongated to obtain a conductor having a desired shape.

In a superconductor, a metal stabilizing material is combined with a superconductor molded body to cope with a so-called quench phenomenon in which a superconductive state is lost. For the same purpose as in the oxide superconductor, it is proposed to combine a metal stabilizing material with an oxide superconductor. When the superconductive state is lost, the oxide superconductor becomes an insulator, and it is difficult to conduct heat or electric power to the metal stabilizing material. For this reason, a quench phenomenon more easily occurs. In particular, in alternating-current energization, heat may often be generated by a hysteresis loss. It is very important to appropriately provide a countermeasure against the quench phenomenon of the oxide superconductor.

An oxide superconductor is generally brittle and its crystal has a laminar structure subjected to cleavage. The oxide superconductors tend to crack in installation works. In addition, when an oxide superconductor is used for a magnet, a Lorentz's force acts on the oxide superconductor to crack an oxide superconductor layer. As a result, a critical current density (Jc) is undesirably degraded. Furthermore, since the oxide superconductor has a laminar perovskite crystal structure, crystal anisotropy is strong, and a current flows in a direction parallel to the a-b plane. In order to obtain a high critical current density (Jc), the crystal must be oriented such that its C-axis is perpendicular to a current energization direction. However, since the crystal of the oxide superconductor thus manufactured tend to be oriented randomly, a sufficiently high critical current density Jc cannot be obtained.

SUMMARY OF THE INVENTION

The present invention has been made as a result of extensive studies in consideration of the above situation, and has as its object to provide an oxide superconductor having excellent electromagnetic stability such as a high Jc and high mechanical strength and a method of manufacturing the same.

According to the present invention, there is provided an oxide superconductor in which oxide superconductor layer and metal material layers are alternately laminated a plurality of times.

The oxide superconductor having the above structure according to the present invention has a multilayered structure in which the oxide superconductor layers and the metal material layers are alternately laminated. Therefore, both electromagnetic stability and mechanical strength, which are indispensable factors of the superconductor can be obtained.

According to an embodiment of the present invention, the metal material layers are discontinuously laminated in the circumferential direction of the superconductor because the stabilizing metal layers of the laminated body of the present invention serve as a barrier when the structure is used as a superconductor such as a power cable. Therefore, when the outer superconductor layer is not rendered superconductive, the current does not flow into the inner superconductor layer through the metal material interlayer.

In order to uniformly flow a current in each superconductor layer of the multilayered structure, the metal material layers can be discontinuous in the circumferential direction of the conductor.

For this purpose, the metal material layer may have a porous or net-like structure. Alternatively, a metal material sheet having a small width may be wound around the superconductor in a helical shape so as to partially expose the underlying superconductor layer.

BRIEF DESCRIPTION OF THE DRAWINGS

FIGS. 7A to 7C are sectional views showing metal sheets used in the present invention;

FIGS. 7D to 7F are plan views showing the metal sheets shown in FIGS. 7A to 7C, respectively;

FIG. 8 is a sectional view showing a state wherein an oxide superconductor layer is laminated on a metal sheet;

FIG. 9 is a plan view showing still another metal sheet used in the present invention;

FIGS. 10A and 10B are a sectional view and a plan view, respectively, showing still another metal sheet used in the present invention;

FIG. 14A is a view depicting the enlarged main part of an oxide superconductor cable according to the present invention;

FIG. 14B is a perspective view explaining the directions of the a-, b- and c-axis of the oxide superconductor cable.

FIG. 15 is a sectional view showing various types of stabilizing metal materials used in the method of manufacturing oxide superconductor cables according to the present invention; and FIG. 16 is a sectional view showing a conventional oxide superconductor cable.

DETAILED DESCRIPTION OF THE PREFERRED EMBODIMENTS

Figure 1:
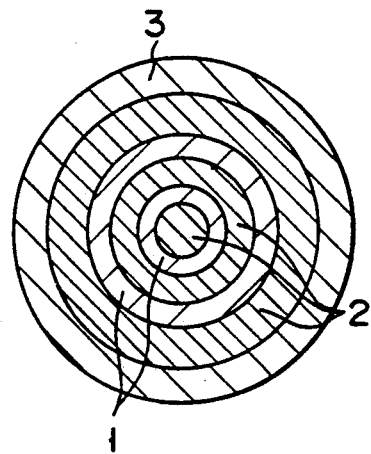
FIGS. 1 to 3 are sectional views showing examples of oxide superconductors according to the present invention.

Embodiments of oxide superconductors according to the present invention are sown in FIGS. 1 to 4. Reference numerals 1 in FIGS. 1 to 4 denote metal material layers; and 2, oxide superconductor layers.

In the oxide superconductor shown in FIG. 1, the metal material layers 1 and the oxide superconductor layers 2 are alternately laminated in a concentric shape, and the outermost layer is constituted by a metal coating layer 3. In the oxide superconductor shown in FIG. 2, the metal material layer 1 and the oxide superconductor layer 2 are formed in a spiral form, and the metal coating layer 3 is used as the outermost layer. The concentric form shown in FIG. 1 includes the spiral form shown in FIG. 2.

Figure 2:
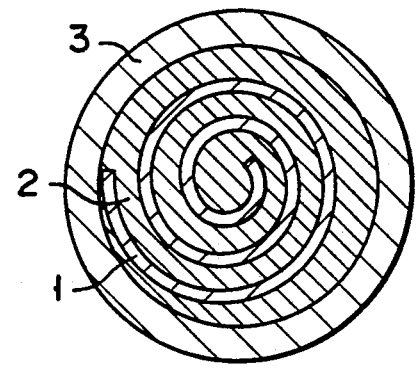
Figure 3:
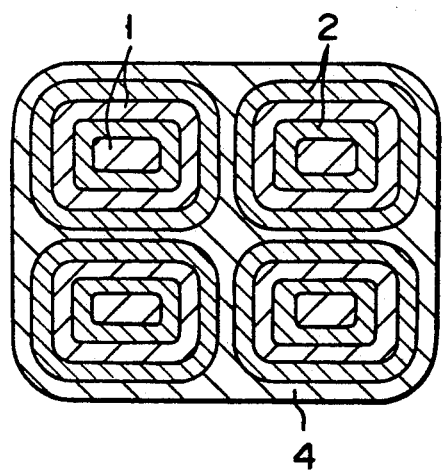

According to the present invention, a plurality of superconductors shown in FIG. 1 or 2 can be bundled and wound around a metal material layer or an oxide superconductor layer, as shown in FIG. 3. In the oxide superconductor shown in FIG. 3, four laminated structures each obtained by alternately laminating the metal material layers 1 and the oxide superconductor layers 2 in a rectangular form are bundled by one metal frame 4.

The spiral laminated structure shown in FIG. 2 can be obtained by alternately laminating the metal sheets and the oxide superconductor sheets and winding the resultant laminated body.

The cross sections of metal sheets used in the method of the present invention are shown in FIGS. 7A, 7B, and 7C, respectively, and the planar patterns thereof are shown in FIGS. 7D, 7E, and 7F, respectively. Projections 7 and/or holes 8 are formed in the metal sheets to increase a contact area with the oxide semiconductor, thereby effectively performing heat dissipation. As shown in FIG. 8, projections 7 of the metal sheet 1 are constituted by a plurality of linear projections 7, and an oxide superconductor 2 is applied between each two projections 7. The resultant metal sheet 1 with the oxide superconductor 2 is wound in a spiral shape to obtain a rod, or the metal sheets with the oxide superconductor are laminated to obtain a sheet-like body. The resultant structure is elongated in a direction of the linear projection 7. Then, the oxide superconductor layers are separated from the projections 7, or the metal distribution density is increased to effectively suppress quenching and hysteresis loss.

Each linear projection formed on the metal sheet need not be continuous. As shown in the plan view of FIG. 9, projections 7 may be distributed as islands. When linear projections 7 are also formed along the sides of the metal sheet, as shown in the sectional and plan views of FIGS. 10A and 10B, the oxide superconductor layers can be shielded from the outer atmosphere by using only the metal sheet without using a metal vessel.

Figures 4, 5:
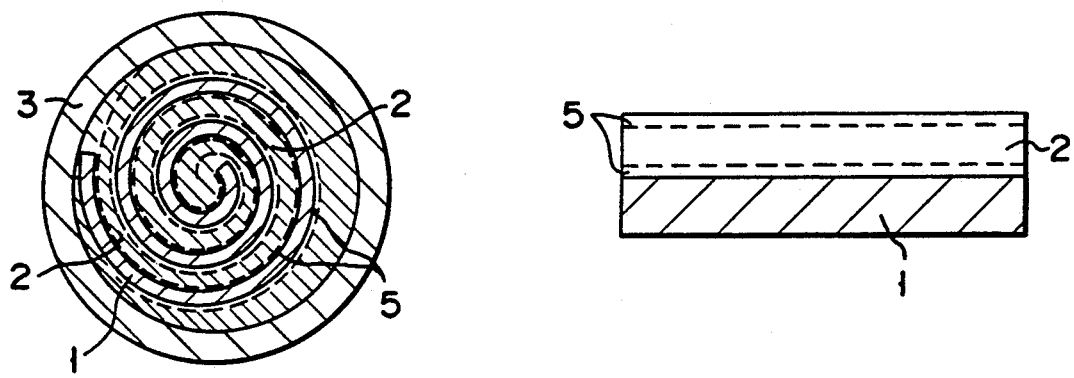
FIG. 4 is a sectional view of an oxide superconductor in which a metal powder (particles) is dispersed in an oxide superconductor layer.
FIG. 5 is an elevational view for explaining a method of manufacturing the superconductor depicted in FIG. 4.

FIG. 4 is a sectional view showing an embodiment of an oxide superconductor in which metal particles are dispersed in the oxide superconductor layer. Referring to FIG. 4, reference numerals 5 denote oxide superconductor layers in which metal particles are dispersed. A ring-like metal layer 3 is formed on the outer circumferential surface of the spiral body of the metal material and oxide superconductor layers 1 and 2. The oxide superconductor layers 5 containing the metal particles are arranged near the metal material layer 1.

Each sectional shape of the superconductor of the present invention can be obtained by working such as rolling or drawing of the concentric superconductor. An example having a rectangular cross section is shown in FIG. 3.

In each oxide superconductor layer described above, lanky crystal particles of which longitudinal direction are oriented in the longitudinal direction of the superconductor and includes at least one particle boundary in a direction perpendicular to the longitudinal direction.

Since the lanky crystal is formed in the oxide superconductor layer in the current energization direction, the lanky crystal allows formation of a thinner wire. When the superconductor body is used as a conductor such as a magnet, higher stability can be obtained.

Various types of oxide superconductors are used in the oxide superconductors of the present invention. Metal materials for the metal material layers are nonreactive with oxide superconductors and are excellent in electrical conductivity and thermal conduction. Examples of the metal material are Ag, Ag—Pd, Ag—Au, Ag—Cu, Ag—Mg, Ag—Pt, Ag—Ir, Au, Au—Ni, Au—Cu, Au—Ag—Cu, Au—Pd—Ag, Au—Ir, Pt, Pt—Ir, Pt—Pd, Pd, Pd—Ni, Pd—Co, Ni—Cr, Ni—Cr—Co, Ni—Fe, Ni—Fe—Co, Fe—Cr, Fe—Ni—Cr (SUS). The lanky crystal particle shape in the oxide superconductor layer according to the present invention is given such that a ratio (aspect ratio) of the length in the longitudinal direction of the superconductor to the length (width) in a direction perpendicular to the longitudinal direction is 10 or more and generally falls within the range of 50 to 1,000 because the C-axis orientation can be improved and a high Jc value can be obtained.

When the metal particles are dispersed at least in an oxide superconductor layer portion adjacent to the metal material layer, and the thickness of each oxide superconductor layer is reduced to 1 mm or less and preferably 0.1 mm or less, the resultant oxide superconductor can be excellent in electrical conductivity and thermal conduction as a whole.

According to a method of manufacturing an oxide superconductor of the present invention, layers of an oxide superconductor or its precursor are alternately laminated with metal material layers by a desired number of times, and the laminated body is covered with the metal material. The laminated body with the coating is elongated as it is or into a desired shape. Predetermined heating and cooling are performed such that the laminated body is heated at a temperature to partially melt the oxide superconductor or its precursor or more and then cooled to recrystallize the oxide superconductor or its precursor.

As the oxide superconductors used in the method of the present invention, intermediate materials between source materials which can be converted into oxide superconductors and the oxide superconductors can be used as precursors in addition to the various oxide superconductors described above. The intermediate material is, e.g., a mixture, a coprecipitation mixture, or oxygen deficient type composite oxides of oxide superconductor constituting elements, or an alloy of the above constituting elements. These precursors are heated in an atmosphere containing oxygen and are reacted into oxide superconductors.

In this method of the present invention, in order to alternately laminate an oxide superconductor or its precursor with the metal material by a desired number of times, it is easy to form sheets of the superconductor or its precursor, and the metal material sheets, and to alternately laminate these sheets to obtain a laminated structure. A method of forming the oxide superconductor or its precursor into a sheet can be a conventional method such as a doctor blade method, extrusion, or screen process printing. It is preferable to add a binder to the oxide superconductor or its precursor upon sheet formation because flexibility is imparted to the resultant sheet.

According to the method of the present invention, the laminated body of sheets of the oxide superconductor or its precursor and the metal material sheets is heated to sinter the molded body, replenish oxygen to the sintered body, and adjust the crystal structure for the oxide superconductor, and to react the precursor into an oxide superconductor, to sinter the molded body, replenish oxygen to the sintered body, and adjust the crystal structures for the precursor. The oxide superconductor or its precursor is heated at a temperature to partially melt it or more because the lanky crystals are grow in the longitudinal direction during cooling and are oriented in the C-axis having a high conductivity. The laminated body is slowly moved in a furnace having a temperature gradient to facilitate lankiness of the crystals and C-axis orientation.

According to the method of the present invention, the laminated body of the oxide superconductor sheets and the metal sheets is elongated by filling the laminated body into a metal vessel or covering the laminated body with a metal sheet because the oxide superconductor layers become more dense and are separated from the outer atmosphere to obtain a perfect moisture-proof structure, and are free from entrance of toxic substances. Any elongation method such as rolling, extrusion, groove rolling, swaging, or drawing can be applied.

The oxide superconductor shown in FIG. 4 is manufactured as follows. As shown in FIG. 5, a sheet of the oxide superconductor 5 containing metal particles, a sheet of the oxide superconductor 2 which does not contain the metal particles, and another sheet are laminated on the metal sheet 1, and the resultant body is wound in a spiral shape such that the metal sheet 1 becomes the outermost layer. The spiral body is filled in a metal pipe. The resultant structure is elongated in a desired manner, and predetermined heating is performed.

Figure 6:
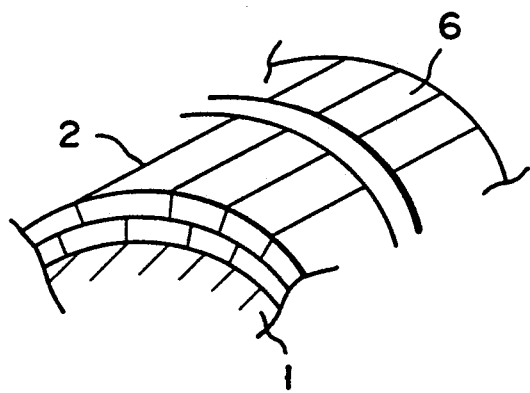
FIG. 6 is a partial perspective view for explaining a crystal structure of an oxide superconductor layer of an oxide superconductor according to the present invention.

A crystal structure of an oxide superconductor layer of an oxide superconductor of the present invention will be described with reference to FIG. 6. FIG. 6 is a view showing part of a crystal structure of an oxide superconductor.

An oxide superconductor layer 2 is formed on a metal material layer 1, and the oxide superconductor layer 2 is made of a plurality of lanky crystal particles 6 parallel to the axis of the superconductor. The particle boundary of the crystal particles has a pinning effect for restricting movement of a magnetic field. In a ferromagnetic magnet or AC energization, a high Jc can be stably obtained.

According to the method of the present invention, a so-called Wind & React method can also be utilized wherein an elongated material of the laminated body is, for example, wound into a magnet coil and this coil is heated to obtain an oxide superconductor having good orientation. This method is very effective to form the oxide superconductor having poor workability into a magnet or the like.

In a ceramic superconductor in which an Ag layer or an Ag alloy layer is combined with a ceramic superconductor layer, a high-strength, heat-resistant metal material can be embedded in the combined Ag or Ag alloy layer continuously in the longitudinal direction of the superconductor directly or through a noble metal layer.

The Ag or Ag alloy is used as the metal material layer of the ceramic superconductor constituted by the ceramic superconductor layer and the metal material layer according to the present invention, and the high-strength, heat-resistant metal material can be continuously embedded in the Ag or Ag alloy layer in the longitudinal direction of the superconductor. Therefore, elongation deformation of the superconductor by a tension or the like can be prevented. The high-strength, heat-resistant metal material may be directly embedded in the Ag or Ag alloy layer. However, a noble metal layer is preferably coated on the high-strength, heat-resistant metal material, and the metal material with the noble metal layer is embedded into the Ag or Ag alloy layer to prevent oxidation of the metal material.

As described above, the Ag or Ag alloy layer is used as the metal material layer combined with the ceramic superconductor due to the following reasons. Since Ag or an Ag alloy is excellent in oxygen permeability, a sufficient amount of oxygen is supplied to the ceramic superconductor during heating, thereby obtaining a high Jc. In addition, since Ag or an Ag alloy has a high heat conductivity, a quenching phenomenon, i.e., a thermal transition from superconductivity to normal conductivity, can be suppressed, and the energization amount can be increased.

Any metal material combined with the ceramic superconductor ca be used according to the present invention if it is excellent in oxygen permeability and thermal conduction. For example, an Ag alloy such as Ag—Ir, Ag—Pd, or Ag—Au can be used.

Figure 11:
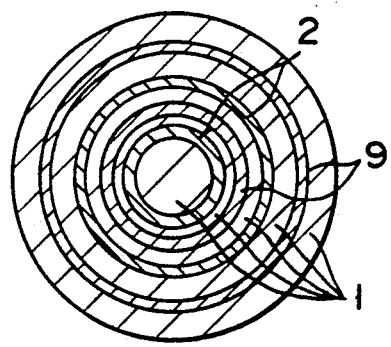
FIG. 11 is a sectional view showing a superconductor in which a high-strength, heat-resistant metal material is combined with an oxide superconductor according to the present invention.

In a superconductor shown in FIG. 11, an Ag layer 1, a ceramic superconductor layer 2, and a highstrength, heat-resistant metal material 9 are combined in a concentric manner.

The superconductor shown in FIG. 11 is manufactured as follows. A ceramic superconductor material, and an Ag material or a high-strength, heat-resistant metal material are worked into rods or pipes, respectively. These rods or pipes are engaged with each other to obtain a composite billet. The composite billet is worked into a wire rod having a desired shape by the same elongation as described above. The resultant wire rod is heated at a temperature of, in most cases, 800° to 1,000° C. to cause a reaction and sintering of the ceramic superconductor material into a ceramic superconductor, supply of oxygen to the sintered body, or adjustment of the crystal structure, thereby manufacturing a ceramic superconductor.

A material which has high strength and cannot be melted or softened during heating in the subsequent process is used as the high-strength, heat-resistant metal material embedded in the Ag layer. Examples of such a material are metals such as Fe—Ni—Cr (SUS), Ni, and W. The high-strength, heat-resistant metal material is preferably coated with a noble metal such as Au, Pt, Rh, or Pd by plating or vapor deposition, thereby preventing oxidation of the metal material.

As the ceramic superconductor materials used in the method of the present invention, intermediate materials between source materials which can be converted into ceramic superconductors and the ceramic superconductors can be used as precursors in addition to the various ceramic superconductors described above. The intermediate material is, e.g., a mixture, a coprecipitation mixture, or an oxygen deficient type composite oxides of ceramic superconductor constituting elements, or an alloy of the above constituting elements. These precursors are heated in an atmosphere containing oxygen and are reacted into ceramic superconductors.

Since the metal material is distributed in the form of a layer in the oxide superconductor layer in the oxide superconductor of the present invention, it is excellent in electrical conductivity and thermal conduction. Therefore, quenching and the hysteresis loss by AC energization can be suppressed.

The crystal structure of the oxide superconductor layers partitioned by the metal material layers is constituted by crystal particles grown lanky in the longitudinal direction of the superconductor. Accordingly the number of crystal particle boundaries accounting for energization resistance is small in the energization direction, and at least one crystal particle boundary is contained in a direction perpendicular to the lanky crystal particles. Therefore, a uniform, high Jc can be obtained.

In the method of manufacturing the above oxide superconductor according to the present invention, the laminated body of the oxide superconductor and the metal is heated at a temperature to partially melt the oxide superconductor or more, and is then cooled to recrystallize the oxide superconductor such that crystallization of the molten oxide superconductor progresses to portions between the metal layers. Therefore, the crystal particles are grown lanky in the longitudinal direction and are oriented in the C-axis.

The present invention will be described in detail by way of its examples.

EXAMPLE 1

$Bi_2O_3$, SrO, CaO, and CuO were mixed such that Bi : Sr : Ca : Cu was given as an atomic ratio of 2 : 2 : 1 : 2, the resultant powder was pre-burnt in air at 850° C. for three hours, and the pre-burnt body was pulverized and classified to obtain a pre-burnt powder of $Bi_2Sr_2CaCu_2O_x$ having an average particle size of 8/μm.

Ten vol% of methyl cellulose and 10 vol% of methyl cellosolve as binders were mixed with the pre-burnt powder, and the resultant mixture was kneaded by a roll. From the kneaded mass, a tape-like green sheet having a thickness of 0.7 mm was formed by a doctor blade method. This green sheet was placed on an Ag sheet having a thickness of 0.7 mm, and the laminated body was wound in a spiral form such that the Ag sheet faces outward, thereby obtaining a rod having a diameter of 15 mm. The rod was heated to 150° C. to eliminate volatile components such as binders, and then heated in air at 800° C. for an hour. The heated body was then cooled, and the cooled body was filled in an Ag pipe having an inner diameter of 15 mm and a wall thickness of 2 mm. This Ag pipe was sealed in a vacuum, and subjected to hot isostatic pressing (HIP) at 500° C. and 1,000 atm. The Ag pipe filled with the spiral body and subjected to HIP was formed into a 5.0-mm diameter wire material by swaging. This wire material was rolled into plate materials having thicknesses of 2.5 mm, 1.0 mm, and 0.5 mm.

The plate materials were heated at 920° C. for an hour, and the oxide superconductor layers were partially melted. Thereafter, the plate materials were gradually cooled to 860° C. over three hours, heated at 860° C. for eight hours, maintained at 820° C. for six hours and then cooled. By this series of heating and cooling operations, plate-like oxide superconductors were manufactured.

EXAMPLE 2

Plate-like oxide superconductors were manufactured following the same procedures as in Example 1 except that Ag pipes filled with spiral bodies and subjected to HIP were rolled without swaging to obtain plate members having thicknesses of 10 mm, 7.5 mm, and 5 mm.

EXAMPLE 3

Fifteen % of an Ag powder (particles) having a diameter of 1 μm were mixed with a pre-burnt $Bi_2Sr_2CaCu_2O_x$ powder, binders as in Example 1 were mixed with the resultant powder mixture, and a green sheet having a thickness of 0.15 mm was formed by a doctor blade method.

The green sheets containing the Ag powder were placed on the upper and lower surfaces of a 0.7-mm thick green sheet as in Example 1, and the resultant body was placed on a 0.7-mm thick Ag sheet. The resultant body was wound in a spiral form such that the Ag sheet faced outward, thereby obtaining a rod having a diameter of 15 mm. Thereafter, from the rod, a plate-like oxide superconductor having a thickness of 1.0 mm was manufactured following the same procedures as in Example 1.

EXAMPLE 4

A plate-like oxide superconductor having a thickness of 1.0 mm was manufactured following the same procedures as in Example 3 except that 0.15-mm thick green sheets placed on the upper and the lower surfaces of the 0.7-mm thick green sheet comprised green sheets without containing an Ag powder.

COMPARATIVE EXAMPLE 1

Plate-like oxide superconductors were manufactured following the same procedures as in Examples 1 and 2 except that heating at 920° C. for an hour for partial melting in heating of the plate materials and subsequent gradually cooling were omitted in Examples 1 and 2.

Crystal particle shapes, Jc values, and crystal orientations of the oxide superconductor layers of the oxide superconductors thus obtained were measured.

The critical current densities Jc were measured by a four-terminal method at 77K using 1 $\mu$V/cm as a standard. Crystal orientation F was calculated by the following equation such that an internal oxide superconductor layer was exposed and irradiated with X-rays, and diffraction intensities of the exposed portions were substituted:

$$F = (Po - Poo)/(1 - Poo)$$

where
Po is the diffraction intensity ratio of the oxide superconductor layer
Poo is the diffraction intensity ratio of the uniformly mixed oxide superconductor powder $$Po \text{ or } Poo = \Sigma I(ool)/I(hkl)$$

where (hkl) is the intensity of the (hkl) diffraction beam. The crystal particle shapes were represented by measuring lengths and widths of crystal particles.

Results are summarized in Table 1 below together with the manufacturing conditions.

lar to the longitudinal direction were reduced. In addition, the particle boundaries in the longitudinal direction exhibited the pinning effect.

In the samples of the examples of the present invention, when the thickness of the oxide superconductor layer is decreased, the critical current density Jc is increased. This is considered to be attributable to the fact that a ratio of the length of the crystal particle to its width is increased when the thickness of the oxide superconductor layer is decreased, thereby increasing C-axis orientation of the crystal particles. In addition, in the sample (No. 7) in which the Ag powder (particles) is distributed in the oxide superconductor layer portion near the metal material layer, a higher Jc is obtained than the sample (No. 8) in which the Ag powder is not distributed. This is because the thermal conduction and electrical conductivity from the oxide superconductor layer to the metal material layer are improved due to the presence of the Ag powder.

To the contrary, in the comparative examples, the oxide superconductor layer heated by a low heating temperature was not partially melted, and the crystal structure of the oxide superconductor was constituted by isometric crystals. As a result, the particle boundaries in a direction perpendicular to the longitudinal direction were increased, and the crystal particle were oriented randomly. Therefore, the critical current densities Jc became low.

In the sample in which the metal particles such as Ag particles were dispersed, the mechanical strength, especially, toughness, could be increased. It was found that cracks caused during installation works or by Lorentz's forces could be prevented.

TABLE 1

| | Items | No. | Thickness of Super-conductor (mm) | Thickness of Super-conductor layer (mm) | Ag Powder in Super-conductor layer | Partial Melting during Heating | Crystal Particle Size ($\mu$m) Length | Crystal Particle Size ($\mu$m) Width | Jc A/cm$^2$ | F (%) |
|---|---|---|---|---|---|---|---|---|---|---|
| Samples of Present Invention | Example 1 | 1 | 2.5 | 0.06 | Absent | Yes | 250 | 15 | 8800 | 90 |
| | " | 2 | 1.0 | 0.025 | " | " | 600 | 15 | 9900 | 94 |
| | " | 3 | 0.5 | 0.015 | " | " | 900 | 20 | 11000 | 97 |
| | Example 2 | 4 | 10 | 0.30 | " | " | 50 | 10 | 3300 | 60 |
| | " | 5 | 7.5 | 0.18 | " | " | 70 | 10 | 3800 | 70 |
| | " | 6 | 5 | 0.13 | " | " | 70 | 10 | 4500 | 80 |
| | Example 3 | 7 | 1.0 | 0.03 | Present | " | 600 | 15 | 10100 | 95 |
| | Example 4 | 8 | " | " | Absent | " | " | " | 9200 | 95 |
| Samples of Comparative Example | Comparative Example 1 | 9 | 2.5 | 0.06 | Absent | No | 10 | 10 | 800 | 0 |
| | Comparative Example 1 | 10 | 1.0 | 0.025 | " | " | " | " | 1000 | 0 |
| | Comparative Example 1 | 11 | 0.5 | 0.015 | " | " | 7 | 7 | 1200 | 0 |
| | Comparative Example 1 | 12 | 10 | 0.30 | " | " | 15 | 15 | 200 | 0 |
| | Comparative Example 1 | 13 | 7.5 | 0.18 | " | " | " | " | 300 | 0 |
| | Comparative Example 1 | 14 | 5 | 0.13 | " | " | " | " | " | 0 |

As is apparent from Table 1, the examples (sample Nos. 1 to 8) of the present invention had higher critical current densities Jc than comparative examples (sample Nos. 9 to 14).

In the samples of the examples of the present invention, since the oxide superconductor layers were heated at a temperature to partially melt the oxide superconductors during heating or more, the lanky crystal particles were oriented in the C-axis during cooling and were grown in the longitudinal direction of the superconductor. The particle boundaries which accounted for energization resistance in the direction perpendicu-

EXAMPLE 5

Influences of the thicknesses of the oxide superconductor layers, and heating conditions on crystal orientation of oxide superconductor layers were taken into consideration.

Green sheets as in Example 1 were placed on 0.7-mm thick Ag sheets, respectively, and the laminated body were wound in spiral form such that the Ag sheet faces outward. The spiral bodies were subjected to HIP as in Example 1. The HIP-treated bodies were heated at 920° C. for an hour under the same conditions as in Example 1 or in air to partially melt the oxide superconductor layers. The bodies were then moved at a rate of 1 cm/five hours in a furnace having a temperature gradient and cooled from 920° C. to 820° C. at a rate of 40° C./cm.

Crystal orientation F of the oxide superconductors thus obtained were measured following the same procedures as in Example 1. Results are summarized in Table 2 together with the manufacturing conditions.

TABLE 2

| No. | No. of laminating Green Sheets | Thickness of Superconductor Layer (mm) | Temperature Gradient in Furnace during Cooling | F % |
|---|---|---|---|---|
| 1 | 1 | 0.6 | No | 40 |
| 2 | 2 | 0.8 | " | 15 |
| 3 | 4 | 1.7 | " | 5> |
| 4 | 4 | 1.7 | Yes | 35 |

As is apparent from Table 2, the crystal orientation is increased when the thickness of the oxide superconductor layer is decreased. When the thickness exceeds 1 mm, crystal orientation is rarely exhibited. Crystal orientation of the sample moved in the furnace having a temperature gradient was greatly increased even if the thickness of the oxide superconductor layer was large.

EXAMPLE 6

Five % of an Ag powder (average particle size: 1 μm) and 3% of $Ho_2BaCuO_5$ powder (average particle size: 0.5/μm) were mixed with an $HoBa_2Cu_3O_{7-\delta}$ pre-burnt powder (average particle size: 5 μm), and 10% of methyl cellulose and 10% of butyl cellosolve as binders were mixed therewith. The resultant mixture was kneaded by a roll, and a green sheet having a thickness of 0.5 mm was formed by a doctor blade method. A metal sheet was prepared by plating Ag to a thickness of 15 μm on a 0.1-mm thick Ni sheet having 8-mm diameter holes formed at intervals of 10 mm. Twenty green sheets and 21 metal sheets prepared in this manner were alternately laminated, and the resultant laminated body was dried at 150° C. and pre-burnt at 500° C. The pre-burnt body was filled in an Ag vessel having inner dimensions of 100×100×10 mm and a wall thickness of 2 mm and was sealed in a vacuum. The sealed vessel was subjected to HIP in an Ar atmosphere at 600° C. and 1,000 atm. The HIP-treated vessel was rolled to have thickness of 0.8 mm. The rolled material was heated in an $O_2$ flow at 900° C. for six hours and was cooled to room temperature at a rate of 3° C./minute to manufacture a sheetlike oxide superconductor.

EXAMPLE 7

Fifteen % of polyvinyl alcohol and 15% of propyl cellosolve as binders were mixed with a $Bi_2Sr_2Ca_{1.1}Cu_{2.1}O_x$ pre-burnt powder (average particle size: 3 μm), and the resultant mixture was kneaded to obtain a pre-burnt powder paste. Linear projections 7 each having a width of 1 mm and a height of 0.5 mm were formed on a metal sheet shown in FIG. 8 at a pitch of 5 mm, thereby preparing a 0.5-mm thick Ag sheet 1. The pre-burnt powder paste was applied by a rubber roll between the linear projections 7 on the Ag sheet 1. The Ag sheet was wound in a spiral form so that the linear projections were parallel to the longitudinal direction to obtain a 25-mm diameter rod. This rod was filled in an Ag pipe having an inner diameter of 25 mm and a wall thickness of 2 mm. The filled Ag pipe was heated to 800° C. at a rate of 5° C./minute and was then subjected to drying, binder elimination, and pre-sintering. The Ag pipe was sealed in a vacuum and was subjected to HIP in an Ar atmosphere at 500° C. and 1,000 atm. The Ag pipe with the contents was swaged by a swager to a wire rod having a diameter of 5 mm and then drawn into a wire rod having a diameter of 2 mm. This wire rod was rolled while twisting it at a pitch of 1/150 to prepare a rolled material having a thickness of 0.8 mm. The rolled material was heated in air at 840° C. for 12 hours and was then cooled to room temperature at a rate of 3° C./min. Alternatively, the rolled material having a thickness of 0.8 mm was kept heated at 900° C. for half an hour and gradually cooled to 840° C. over 30 minutes prior to the above heating operation, and thereafter, the above-mentioned heating operation was performed. Heating was performed by either method to obtain a tape-like oxide superconductor.

EXAMPLE 8

Tape-like oxide superconductors were manufactured following the same procedures as in Example 7 except that Ag sheets without linear projections were used as metal sheets in Example 7.

COMPARATIVE EXAMPLE 2

Oxide superconductors were manufactured following the same procedures as in Example 6 except that the Ag vessels filled with the laminated bodies were heated without rolling after the HIP treatment.

COMPARATIVE EXAMPLE 3

Oxide superconductors were manufactured following the same procedures as in Example 6 except that the Ag vessels filled with the spiral rods were heated without working after the HIP treatment.

COMPARATIVE EXAMPLE 4

Oxide superconductors were manufactured following the same procedures as in Example 8 except that the Ag vessels filled with the spiral rods were pre-sintered and subjected to HIP, and heated without working.

Magnetic shield effects of the sheet-like oxide superconductors were measured. The magnet shield effect was measured such that an electromagnet which generated a magnetic field having a strength of 20 gauss was shielded by the above mentioned superconductor cooled to 77K, and an external magnetic force was measured by a gaussmeter.

Results are summarized in Table 3 together with the manufacturing conditions.

TABLE 3

| | Items | No. | Type of Superconductor | Metal Sheet | Working of Laminated Body | Pre-heating | Jc A/cm$^2$ | Crystal Orientation % | Shield Effect % |
|---|---|---|---|---|---|---|---|---|---|
| Samples of | Example 6 | 1 | Ho based | Holes | Rolling | No | 4500 | 35 | 99 |
| | Example 7 | 2 | Bi based | Pro- | Drawing | " | 7300 | 66 | — |

TABLE 3-continued

| Items | | No. | Type of Super-conductor | Metal Sheet | Working of Laminated Body | Pre-heating | Jc A/cm$^2$ | Crystal Orientation % | Shield Effect % |
|---|---|---|---|---|---|---|---|---|---|
| Method of Present Invention | | | | | jections and rolling | | | | |
| | " | 3 | " | Projections | Drawing and rolling | Yes | 12900 | 97 | — |
| | Example 8 | 4 | " | None | Drawing and rolling | No | 5100 | 65 | — |
| | " | 5 | " | " | Drawing and rolling | Yes | 9300 | 92 | — |
| Samples of Method of Comparative Example | Comparative Example 2 | 6 | Ho based | Holes | None | No | 300 | 0 | 93 |
| | Comparative Example 3 | 7 | Bi based | None | " | No | 300 | 0 | — |
| | Comparative Example 4 | 8 | " | " | " | Yes | 1600 | 41 | — |

As is apparent from Table 3, the samples of the examples (sample Nos. 1 to 5) of the method of the present invention have larger Jc values and higher shield effects as compared with the samples of the method of the comparative examples (sample Nos. 6 to 8). This difference is caused depending upon whether the elongation step of the laminated body is performed, as is apparent upon comparison of sample Nos. 1, 4, and 5 of the present invention with sample Nos. 6, 7, and 8 of the comparative examples. The oxide superconductor layer of the method of the present invention had higher crystal orientation and became dense since elongation was performed.

The samples (Nos. 2 and 3) having the projections on the metal sheets have larger Jc values than the samples (Nos. 4 and 5) having no projections because the metal was finely distributed and quenching and the hysteresis loss were effectively suppressed. In the samples (Nos. 3 and 5) subjected to preheating prior to heating have larger Jc values than the samples (Nos. 2 and 4) subjected to heating without preheating. This is because the oxide superconductor was partially melted by preheating and crystal orientation was increased.

The Ag powder was mixed in the oxide superconductor powder in Example 6 in order to increase adhesion strength between the oxide superconductor layer and the metal layer, to increase heat conductivity, and to promote supply of oxygen during heating, thereby increasing Jc values and the like.

The crystal orientation of sample Nos. 2 to 5 is higher than that of sample No. 1 due to different working methods. That is, drawing contributed to improve the crystal orientation as compared with rolling.

Still another embodiment of oxide superconductor wires according to the present invention will be described with reference to the accompanying drawings.

Figure 12:
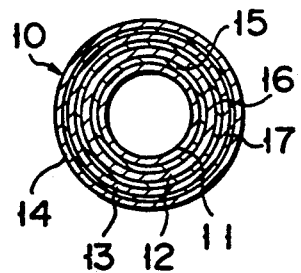
FIGS. 12 and 13 are sectional views showing other examples of oxide superconductor cables according to the present invention.

An oxide superconductor wire 10 shown in FIG. 12 comprises a plurality of stabilizing metal layers 11, 12, 13, and 14 having ring-like sectional shapes of different diameters, and a plurality of oxide superconductor layers 15, 16, and 17 having ring-like sectional shapes of different diameters. The stabilizing metal layers 11 to 14 and the oxide superconductor layers 15 to 17 were alternately laminated in an order of the stabilizing metal layer 11, the oxide superconductor layer 15, the stabilizing metal layer 12, the oxide superconductor layer 16, the stabilizing metal layer 13, the oxide superconductor layer 17, and the stabilizing metal layer 14 from the center to the outer surface of the oxide superconductor wire 10.

Figure 13:
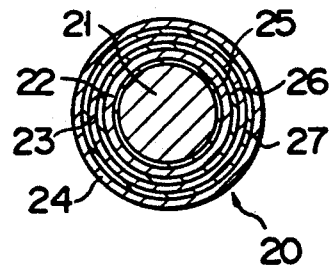

An oxide superconductor wire 20 shown in FIG. 13 has the same basic structure as the oxide superconductor wire 10 in FIG. 12. The oxide superconductor wire 20 comprises a plurality of stabilizing metal layers 21, 22, 23, and 24 and a plurality of oxide superconductor layers 25, 26, and 27, which are alternately laminated in the radial direction. The stabilizing metal layer 21 at the core comprises a rod, and other stabilizing metal layers 22 to 24 and the oxide superconductor layers 25 to 27 are ring-like sectional shapes.

In the wire described above, the stabilizing metal layers 11 to 14 and 21 to 24 are made of, e.g., silver or a nickel-based alloy. The oxide superconductor layers 15 to 17, and 25 to 27 are made of a known composition such as Lu—Ba—Cu—O or Bi—Sr—Ca—Cu—O.

As shown in FIGS. 14A and 14B, when the oxide superconductor layers 15 to 17 and 25 to 27 are constituted by an aggregate of an oxide powder having the longitudinal direction as an a-b plane and the direction of thickness as the c-axis, critical current densities (Jc) of the oxide superconductor layers 15 to 17 and 25 to 27 can be increased.

The thickness of each of the oxide superconductor layers 15 to 17 and 25 to 27 is 200 μm or less and is preferably as small as possible.

The thickness of each of the stabilizing metal layers 11 to 14 and 21 to 24 is as small as possible so as to minimize the outer diameter of each of the superconductor wires 10 and 20. When the thickness is excessively small, the stabilizing function inherent to this metal layer is impaired.

The thickness of each of the stabilizing metal layers 11 to 14 and 21 to 24 is preferably set to be several times that of each of the oxide superconductor layers 15 to 17 and 25 to 27.

The number of oxide superconductor layers in each of the oxide superconductor wires 10 and 20 is arbitrarily set to be two or more, and the number of stabilizing metal layers is set accordingly.

Only the core portion of the oxide superconductor wire 10 in FIG. 12 is hollow, whereas the core portion of the oxide superconductor wire 20 in FIG. 13 is solid.

As shown in FIG. 12, when the core portion of the oxide superconductor wire 10 is hollow, the hollow core portion can serve as a refrigerant flow path to improve cooling capacity, thereby obtaining a more desirable oxide superconductor wire.

FIG. 15 shows tubular stabilizing metal materials 30a, 31, 32, 33, and 34 to which an oxide powder is applied, and a rod-like stabilizing metal material 30b.

The stabilizing metal materials 30a, 30b, 31, 32, 33, and 34 are made of sliver or a nickel-based alloy.

When the oxide superconductor wire 10 shown in FIG. 12 is to be manufactured, the stabilizing metal materials 30a, 31, 32, 33, and 34 are used, and an oxide powder is applied to the outer surface of the stabilizing material 30a, one or both of the inner and outer surfaces of the stabilizing metal materials 31, 32, and 33, and the inner surface of the stabilizing metal material 34.

A predetermined oxide powder is applied to the outer surfaces of the stabilizing metal materials 30a, 31, 32, 33, and 34, and these stabilizing metal materials 30a, 31, 32, 33, and 34 are combined together.

The surface area of the resultant composite material is reduced by a surface area reducing means such as swaging or rolling. The area-reduced composite material is heated in an oxygen atmosphere, thereby obtaining the oxide superconductor wire 10 shown in FIG. 12.

The oxide superconductor wire 20 shown in FIG. 13 can be manufactured following the same procedures as described above except that the rod-like stabilizing metal material 30b is used in place of the tubular stabilizing metal material 30a.

EXAMPLE 9

Oxide powders including a $Y_2O_3$, $BaCO_3$ and CuO powder were weighed and mixed such that Y : Ba : Cu was given as a molar ratio of 1 : 2 : 3. The resultant powder mixture was pre-burnt in an oxygen atmosphere at 920° C. for 20 hours.

The pre-burnt mixture was heated and melted at 1,300° C. and solidified at a cooling rate of 10° C./sec to obtain a plate having a thickness of 1 mm.

The plate was heated in an oxygen atmosphere at 950° C. for 50 hours and pulverized into an oxide powder having a size of 4 μm in an automatic mortar.

The resultant oxide powder was kneaded with a binder, and the kneaded material was applied to the outer surfaces of the silver stabilizing metal materials 30a, 31, 32, and 33 (Table 4) to a thickness of 20 μm. The binder contained in the kneaded material applied to the stabilizing metal materials 30a, 31, 32, and 33 was eliminated.

The stabilizing metal materials 30a, 31, 32, and 33 which carried the predetermined oxide powder and the silver stabilizing metal material 34 without an oxide powder were combined in a concentric form, and the surface area of the resultant structure was reduced by cold-rolling to obtain a composite wire having an outer diameter of 2 mm.

The composite wire was heated in an oxygen atmosphere at 830° C. for 20 hours to obtain the oxide superconductor wire 10.

EXAMPLE 10

An oxide superconductor wire 20 was manufactured following the same procedures as in Example 9 except that the stabilizing metal material 30b shown in Table 4 was used in place of the stabilizing metal material 30a.

EXAMPLE 11

An oxide superconductor wire 10 was manufactured following the same procedures as in Example 9 except that the oxide powder was replaced with a pre-burnt powder having a particle size of 5 μm.

COMPARATIVE EXAMPLE 5

A pre-burnt powder as in Example 11 was used as an oxide powder for the superconductor, and a silver pipe 41 having an outer diameter of 20 mm and an inner diameter of 15 mm was used as a metal sheath, as shown in FIG. 16. The pipe 41 filled with a pre-burnt powder 42 was worked by a surface area reducing means to obtain a superconductor wire 40 having an outer diameter of 0.5 mm, as shown in FIG. 16.

Critical temperatures Tc, critical current densities Jc, and bending characteristics of Examples 9 to 11, and Comparative Example 5 were measured, and test results are shown in Table 5.

The bending characteristics were measured such that each oxide superconductor wire was bent with a radius of curvature which was 50 times the outer diameter to determine whether the oxide superconductor was damaged. If the oxide superconductor was not damaged, it was represented by a circle; and if the oxide superconductor was damaged, it was represented by a cross.

TABLE 4

|  | Outer Diameter (mm φ) | Inner Diameter (mm φ) |
| --- | --- | --- |
| Stabilizing Metal Material 30a | 15 | 13 |
| Stabilizing Metal Material 30b | 15 | — |
| Stabilizing Metal Material 31 | 18 | 16 |
| Stabilizing Metal Material 32 | 21 | 19 |
| Stabilizing Metal Material 33 | 24 | 22 |
| Stabilizing Metal Material 34 | 25 | 25 |

TABLE 5

|  | Tc | Jc (A/cm$^2$) | Bending Characteristics |
| --- | --- | --- | --- |
| Example 9 | 90 | 18500 | ○ |
| Example 10 | 90 | 18300 | ○ |
| Example 11 | 89 | 2900 | ○ |
| Comparative Example 5 | 87 | 1750 | X |

As is apparent from Table 5, the samples of examples 9 to 11 of the present invention have excellent bending characteristics, are free from damage, and larger Jc values than the sample of Comparative Example 5. In particular, the samples of Examples 9 and 10 have excellent properties.

As has been described above, in the oxide superconductor of the present invention, the metal is finely distributed in the oxide superconductor in the form of a layer. The oxide superconductor is excellent in thermal and electrical conductivities. The oxide superconductor layer present between the metal layers is constituted by lanky crystal oriented in the C-axis. The oxide superconductor layer has particle boundaries which exhibit the pinning effect, so that the oxide superconductor has excellent superconductive characteristics such as a higher critical current density (Jc) and excellent mechanical characteristics (bending characteristics). In addition, a laminated body of an oxide superconductor or its precursor and a metal is heated at a temperature to partially melt the oxide superconductor or its precursor or more, thereby easily manufacturing the superconductor described above and providing a remarkable industrial effect.

According to the method of the present invention, a metal sheet is continuously distributed in an oxide superconductor layer, and this structure is elongated. Therefore, the oxide superconductor layer becomes dense and crystal orientation can be increased. In addition, since the metal sheet serves as a thermal and electrical conductor in the oxide superconductor, quenching and hysteresis loss can be suppressed to increase a Jc value and improve the shield effect, thereby rationally manufacturing oxide superconductors having excellent properties, and providing a remarkable industrial effect.

What is claimed is:

1. An oxide superconductor comprising a plurality of oxide superconductor layers and a plurality of metal material layers which are alternately laminated on each other, said metal material layers being nonreactive with the oxide superconductor layers and being electrically and thermally conductive, said metal material layers comprising a metal selected from the group consisting of Ag, Ag—Pd, Ag—Au, Ag—Cu, Ag—Mg, Ag—Pt, Ag—Ir, Au, Au—Ni, Au—Cu, Au—Ag—Cu, Au—Pd—Ag, Au—Ir, Pt, Pt—Ir, Pt—Pd, Pd, Pd—Ni, Pd—Co, Ni—Cr, Ni—Cr—Co, Ni—Fe, Ni—Fe—Co, Fe—Cr and Fe—Ni—Cr (SUS).

2. The oxide superconductor according to claim 1, further comprising a heat-resistance metal material.

3. The oxide superconductor according to claim 1, wherein the metal material layers are continuous in a longitudinal direction of the superconductor and are discontinuous in a circumferential direction of the superconductor.

4. The oxide superconductor according to claim 1, wherein the oxide superconductor layers and the metal material layers are alternately laminated a plurality of times on each other in a concentric form.

5. The oxide superconductor according to claim 1, wherein the plurality of oxide superconductive layers and the plurality of metal material layers are alternately laminated on each other in a spiral form.

6. The oxide superconductor according to claim 1, wherein the plurality of oxide superconductor layers and the plurality of metal material layers are alternately laminated on each other in a plate form.

7. The oxide superconductor according to claim 1, wherein the oxide superconductor is a material selected from the group consisting of $La_{2-x}Ba_xCuO_4$, $La_{2-x}Sr_xCuO_4$, $Y(Dy, Er, Ho)Ba_2Cu_3O_{7-\delta}$ $Bi_2Sr_2CaCu_2O_8$, $Bi_2Sr_2Ca_2Cu_3O_{10}$, $Tl_2Ba_2CaCu_2O_8$, $Tl_2Ba_2Ca_2Cu_3O_{10}$, and $TlBa_2Ca_2Cu_7O_{8.5}$.

8. The oxide superconductor according to claim 2, wherein the heat-resistant metal material is a metal selected from the group consisting of Fe—Ni—Cr (SUS), Ni, W and this metal is coated with a noble metal.

9. The oxide superconductor according to claim 1, wherein the oxide superconductor layer contains lanky crystal particles of which in their longitudinal direction are oriented in a longitudinal direction of the superconductor and includes at least one crystal particle boundary in a direction perpendicular to the longitudinal direction.

10. The oxide superconductor according to claim 1, wherein the superconductor has a polygonal cross section.

11. The oxide superconductor comprising a plurality of oxide superconductors of claim 1, which are bundled and covered with a metal material layer or an oxide superconductor layer.

12. The oxide superconductor according to claim 9, wherein the aspect ratio of the length in the longitudinal direction of the superconductor to the width in a direction perpendicular to the longitudinal direction is at least 10.

13. An oxide superconductor according to claim 12, wherein the aspect ratio is 50 to 1,000.

14. The oxide superconductor according to claim 13, wherein the thickness of each oxide superconductor layer is 0.015 mm to 1 mm.

15. The oxide superconductor according to claim 13, wherein the thickness of each oxide superconductor layer is 0.015 mm to 0.1 mm.

16. The oxide superconductor according to claim 8, wherein the noble metal is selected from the group consisting of Au, Pt and Pd.

17. The oxide superconductor according to claim 3, wherein the metal material layer has a porous structure.

18. The oxide superconductor according to claim 1, wherein the metal material layer has a net-like structure.

19. The oxide superconductor according to claim 3, wherein the metal material layer comprises a metal material sheet which is wound around the oxide superconductor.

20. The oxide superconductor according to claim 10, wherein said working comprises rolling.

21. The oxide superconductor according to claim 10, wherein said working comprises drawing.

22. The oxide superconductor according to claim 1, wherein the metal material layer has a plurality of projections on a surface thereof.

23. The oxide superconductor according to claim 1, wherein there are four metal material layers and three oxide superconductor layers.

24. The oxide superconductor according to claim 1, further comprising at least one layer of an oxide superconductor having dispersed metal particles therein, and wherein said at least one layer is disposed between the metal material layer and the oxide superconductor layer, said dispersed metal particles comprising a metal selected from the group consisting of Ag, Ag—Pd, Ag—Au, Ag—Cu, Ag—Mg, Ag—Pt, Ag—Ir, Au, Au—Ni, Au—Cu, Au—Ag—Cu, Au—Pd—Ag, Au—Ir, Pt, Pt—Ir, Pt—Pd, Pd, Pd—Ni, Pd—Co, Ni—Cr, Ni—Cr—Co, Ni—Fe, Ni—Fe—Co, Fe—Cr and Fe—Ni—Cr (SUS).

25. The oxide superconductor according to claim 1, wherein
the metal material layers are continuous in a longitudinal direction of the superconductor and are discontinuous in a circumferential direction of the superconductive;
the oxide superconductor layer contains lanky crystal particles which in their longitudinal direction are oriented in a longitudinal direction of the superconductor and includes at least one crystal particle boundary in a direction perpendicular to the longitudinal direction; and
the aspect ratio of the length in the longitudinal direction of the superconductor to the width in a direction perpendicular to the longitudinal direction is 10 to 1,000.

26. The oxide superconductor according to claim 12, wherein the aspect ratio is 10 to 1,000.

27. The oxide superconductor according to claim 25, wherein the aspect ratio is 10 to 1,000.

28. The oxide superconductor according to claim 13, wherein the thickness of each oxide superconducting layer is 1 mm to 0.1 mm.

29. The oxide superconductor according to claim 1, wherein the superconductor has a rectangular cross section.

30. The oxide superconductor according to claim 29, wherein said dispersed metal particles comprise Ag powder.

* * * * *

UNITED STATES PATENT AND TRADEMARK OFFICE
CERTIFICATE OF CORRECTION

PATENT NO. : 5,104,849
DATED      : April 14, 1992
INVENTOR(S): Shoji SHIGA et al It is certified that error appears in the above-identified patent and that said Letters Patent is hereby corrected as shown below:

Title page, left column, under "Foreign Patent Documents" insert

--0339801   3/1989   European Pat. Office--

Title page, right column, under "Other Publications" insert

--CA 111(14):  125158z, Kozono et al, 1988 - Thin Oxide SC Films.

CA 112(14):  130720b, Hoshiro et al - SC Ceramic Laminate.

CA 112(6) : 47047s, Fuji Electric Co., Prep. of Thin SC Ceramic Boards, 1987.--

Signed and Sealed this

Fourth Day of October, 1994

Attest:

BRUCE LEHMAN

*Attesting Officer*          *Commissioner of Patents and Trademarks*